(12) United States Patent
Yuan et al.

(10) Patent No.: US 11,043,510 B2
(45) Date of Patent: Jun. 22, 2021

(54) ARRAY SUBSTRATE AND DISPLAY PANEL

(71) Applicant: Wuhan China Star Optoelectronics Semiconductor Display Technology Co., Ltd., Wuhan (CN)

(72) Inventors: Chaoyu Yuan, Wuhan (CN); Min Chen, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 50 days.

(21) Appl. No.: 16/496,455

(22) PCT Filed: Apr. 12, 2019

(86) PCT No.: PCT/CN2019/082394
§ 371 (c)(1),
(2) Date: Sep. 23, 2019

(87) PCT Pub. No.: WO2020/124888
PCT Pub. Date: Jun. 25, 2020

(65) Prior Publication Data
US 2020/0357824 A1 Nov. 12, 2020

(30) Foreign Application Priority Data

Dec. 18, 2018 (CN) .......................... 201811555544.9

(51) Int. Cl.
*H01L 27/12* (2006.01)
*H01L 23/00* (2006.01)

(52) U.S. Cl.
CPC ............ *H01L 27/124* (2013.01); *H01L 24/06* (2013.01); *H01L 2224/06133* (2013.01)

(58) Field of Classification Search
CPC ..................................................... H01L 27/124
See application file for complete search history.

(56) References Cited

U.S. PATENT DOCUMENTS

2002/0191140 A1* 12/2002 Eguchi .................. G02F 1/1345
349/149

* cited by examiner

*Primary Examiner* — William A Harriston

(57) ABSTRACT

An array substrate and a display panel are proposed. Each of the signal conversion lines of the array substrate extends in the first direction, and connects two connection terminals adjacent to the each of signal conversion lines. Projections of the connection terminals on the reference plane in the second direction do not overlap. In this manner, the design that the adjacent connection terminals are interlaced can increase the spacing between the adjacent connection terminals, thus resolving the problem that the spacing between connection terminals on the array substrate is excessively small and short circuiting tends to happen when bonding to cause poor bonding in the related art.

10 Claims, 2 Drawing Sheets

ARRAY SUBSTRATE AND DISPLAY PANEL

RELATED APPLICATIONS

This application is a National Phase of PCT Patent Application No. PCT/CN2019/082394 having International filing date of Apr. 12, 2019, which claims the benefit of priority of Chinese Patent Application No. 201811555544.9 filed on Dec. 18, 2018. The contents of the above applications are all incorporated by reference as if fully set forth herein in their entirety.

FIELD AND BACKGROUND OF THE INVENTION

The present disclosure relates to the field of display technology, more particularly, to an array substrate and a display panel.

An array substrate (TFT substrate) formed with a drive circuit, such as a TFT circuit, is an indispensable part of the display device. The array substrate comprises a display area and a bonding area disposed at one end of the display area. The bonding area comprises a signal conversion area and a connection terminal area. The signal conversion area is disposed with signal conversion lines. The connection terminal area is disposed with connection terminals. The signal conversion lines are connected to the connection terminals correspondingly to achieve the bonding between the array substrate and the drive chip based on the connection terminals.

Designs of the signal conversion lines and the connection terminals in the bonding area will directly affect the bonding yield. The higher the resolution of the product is, the denser the connection terminals and signal conversion lines in the bonding area are, the smaller the spacing between adjacent connection terminals is, and the higher the requirement for precision of the bonding process is.

Therefore, there is a need to provide an array substrate to solve the above-mentioned problem.

SUMMARY OF THE INVENTION

The present disclosure provides an array substrate and a display panel to resolve the problem that the spacing between connection terminals on the array substrate is excessively small, and short circuiting tends to happen when bonding to cause poor bonding in the related art.

In order to resolve the above problem, the present disclosure provides the technical schemes as follows.

The present disclosure provides an array substrate. The array substrate comprises a display area and a bonding area. The bonding area is disposed at one end of the display area, and comprises a signal conversion area and an area of connection terminals. The signal conversion area is disposed with signal conversion lines. The area of connection terminals is disposed with the connection terminals. The signal conversion lines are connected to the connection terminals correspondingly.

Each of the signal conversion lines extends in a first direction, and connects two connection terminals adjacent to the each of signal conversion lines. Projections of the connection terminals on a reference plane in a second direction do not overlap. The reference plane is parallel to the first direction and perpendicular to disposition planes of the connection terminals. The second direction is perpendicular to the reference plane.

Optionally, the area of connection terminals comprises at least two sub-areas, projections of connection terminals in the sub-areas on the reference plane in the second direction overlap.

Optionally, the connection terminals in the sub-area have a same size.

Optionally, the connection terminals in the sub-area are formed in a same process.

Optionally, projections of connection terminals in adjacent sub-areas arranged in the first direction on the reference plane in the second direction are connected.

Optionally, projections of connection terminals in all adjacent sub-areas arranged in the first direction on the reference plane in the second direction connect to one another.

Optionally, a spacing exists between projections of connection terminals in adjacent sub-areas arranged in the first direction on the reference plane in the second direction.

Optionally, spacings exist between projections of connection terminals in all adjacent sub-areas arranged in the first direction on the reference plane in the second direction.

Optionally, the spacings existing between the projections of the connection terminals in all the adjacent sub-areas arranged in the first direction on the reference plane in the second direction are the same.

Optionally, spacings between connection terminals in all adjacent sub-areas in the second direction are the same.

The present disclosure further provides a display panel. The display panel comprises an array substrate. The array substrate comprises a display area and a bonding area. The bonding area is disposed at one end of the display area, and comprises a signal conversion area and an area of connection terminals. The signal conversion area is disposed with signal conversion lines. The area of connection terminals is disposed with the connection terminals. The signal conversion lines are connected to the connection terminals correspondingly.

Each of the signal conversion lines extends in a first direction, and connects two connection terminals adjacent to the each of signal conversion lines. Projections of the connection terminals on a reference plane in a second direction do not overlap. The reference plane is parallel to the first direction and perpendicular to disposition planes of the connection terminals. The second direction is perpendicular to the reference plane.

Optionally, the area of connection terminals comprises at least two sub-areas, projections of connection terminals in the sub-areas on the reference plane in the second direction overlap.

Optionally, the connection terminals in the sub-area have a same size.

Optionally, the connection terminals in the sub-area are formed in a same process.

Optionally, projections of connection terminals in adjacent sub-areas arranged in the first direction on the reference plane in the second direction are connected.

Optionally, projections of connection terminals in all adjacent sub-areas arranged in the first direction on the reference plane in the second direction connect to one another.

Optionally, a spacing exists between projections of connection terminals in adjacent sub-areas arranged in the first direction on the reference plane in the second direction.

Optionally, spacings exist between projections of connection terminals in all adjacent sub-areas arranged in the first direction on the reference plane in the second direction.

Optionally, the spacings existing between the projections of the connection terminals in all the adjacent sub-areas arranged in the first direction on the reference plane in the second direction are the same.

Optionally, spacings between connection terminals in all adjacent sub-areas in the second direction are the same.

The beneficial effects of the present disclosure are as follows. The present disclosure provides a new array substrate and a new display panel. The array substrate comprises the display area and the bonding area located at one end of the display area. The bonding area comprises the signal conversion lines and the connection terminals correspondingly connected to each other. Each of the signal conversion lines extends in the first direction, and connects two connection terminals adjacent to the each of signal conversion lines. Projections of the connection terminals on the reference plane in the second direction do not overlap. In this manner, the design that the adjacent connection terminals are interlaced can increase the spacing between the adjacent connection terminals, thus resolving the problem that the spacing between connection terminals on the array substrate is excessively small and short circuiting tends to happen when bonding to cause poor bonding in the related art.

BRIEF DESCRIPTION OF THE SEVERAL VIEWS OF THE DRAWINGS

The accompanying figures to be used in the description of embodiments of the present disclosure or prior art will be described in brief to more clearly illustrate the technical solutions of the embodiments or the prior art. The accompanying figures described below are only part of the embodiments of the present disclosure, from which figures those skilled in the art can derive further figures without making any inventive efforts.

DESCRIPTION OF SPECIFIC EMBODIMENTS OF THE INVENTION

Figure 1:
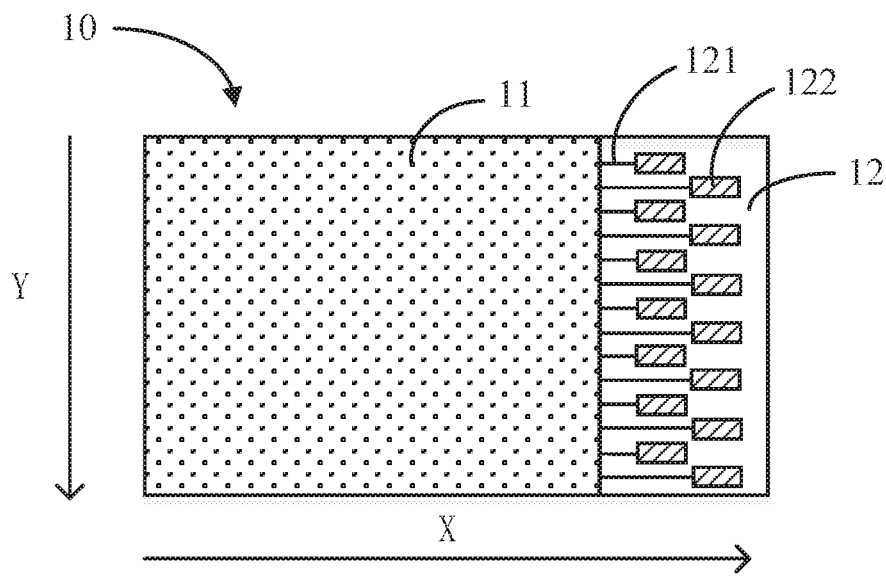
FIG. 1 is a cross-sectional schematic diagram of an array substrate according to one embodiment of the present disclosure.

In the description of the present disclosure, it should be understood that terms such as "center," "longitudinal," "lateral," "length," "width," "thickness," "upper," "lower," "front," "rear," "left," "right," "vertical," "horizontal," "top," "bottom," "inside," "outside," "clockwise," "counterclockwise" as well as derivative thereof should be construed to refer to the orientation as then described or as shown in the drawings under discussion. These relative terms are for convenience of description, do not require that the present disclosure be constructed or operated in a particular orientation, and shall not be construed as causing limitations to the present disclosure.

In order to resolve the problem that the spacing between connection terminals on the array substrate is excessively small, and short circuiting tends to happen when bonding to cause poor bonding in the related art, the embodiments of the present disclosure can resolve the above problem.

A description is provided with reference to FIG. 1. FIG. 1 is a cross-sectional schematic diagram of an array substrate 10 according to one embodiment of the present disclosure.

The embodiment of the present disclosure provides the array substrate 10. The array substrate 10 comprises a display area 11 and a bonding area 12.

The display area 11 comprises a plurality of display devices for performing display functions. The bonding area 12 is disposed at one end of the display area 11 and comprises a signal conversion area and an area of connection terminals 122. The signal conversion area is disposed with signal conversion lines 121. The area of connection terminals 122 is disposed with the connection terminals 122. The signal conversion lines 121 are connected to the connection terminals 122 correspondingly.

The signal conversion lines 121 connect the connection terminals 122 with the display devices in the display area 11 for signal communication.

When a display panel is fabricated, the connection terminals 122 in the binding area 12 are bonded to IC terminals on a flexible circuit board, so that control signals on the flexible circuit board are transmitted to the display area 11 through the connection terminals 122, and signal instructions are executed correspondingly.

The higher the resolution of the product in the related art, the greater the number of connection terminals 122 in the area of the connection terminals 122 is, the smaller the spacing between the adjacent connection terminals 122 is, and the more difficult the connection terminals 122 are bonded to the IC terminals on the flexible circuit board precisely. The yield of the product is lowered. Therefore, the present disclosure provides the following scheme to resolve the above problems.

Each of the signal conversion lines 121 extends in a first direction X, and connects two connection terminals 122 adjacent to the each of signal conversion lines 121. Projections of the connection terminals 122 on a reference plane in a second direction Y do not overlap. The reference plane is parallel to the first direction X and perpendicular to disposition planes of the connection terminals 122. The second direction Y is perpendicular to the reference plane.

Through disposing the two connection terminals 122 that connect adjacent signals in such a manner that their projections on the reference plane in the second direction Y do not overlap, two adjacent terminals in the first direction X are interlaced. A spacing between the two adjacent connection terminals 122 in the second direction Y is at least doubled, which reduces the density of the connection terminals 122 in the area of connection terminals 122. As a result, the alignment fault tolerance of the connection terminals 122 to the IC terminals is increased to improve the product yield.

Figure 2:
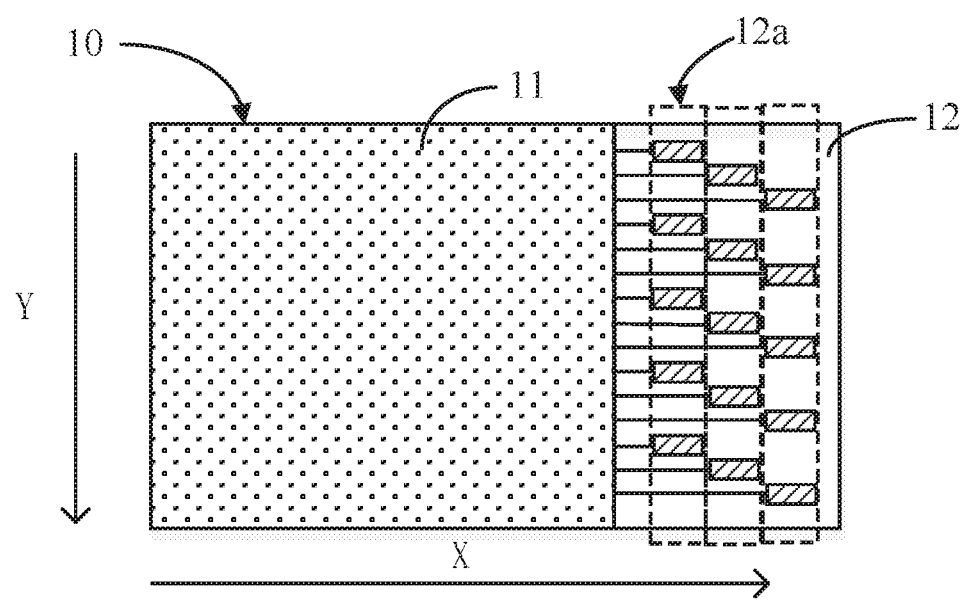
FIG. 2 is a cross-sectional schematic diagram of an array substrate according to another embodiment of the present disclosure.

A description is provided with reference to FIG. 2. FIG. 2 is a cross-sectional schematic diagram of the array substrate 10 according to another embodiment of the present disclosure. The area of connection terminals 122 comprises at least two sub-areas 12a, and projections of connection terminals 122 in the sub-areas 12a on the reference plane in the second direction Y overlap.

Through disposing the connection terminals 122 in the sub-areas 12a in such a manner that their projections on the reference plane in the second direction Y overlap, the connection terminals 122 can be regularly arranged in the area of connection terminals 122. The fabrication efficiency of the array substrate 10 is improved.

The connection terminals 122 in the sub-area 12a have a same size.

The connection terminals 122 in the sub-area 12a are formed in a same process. The present embodiment can improve the bonding yield of the connection terminals 122 and the IC terminals without adding any process for the connection terminals 122.

Figure 3:
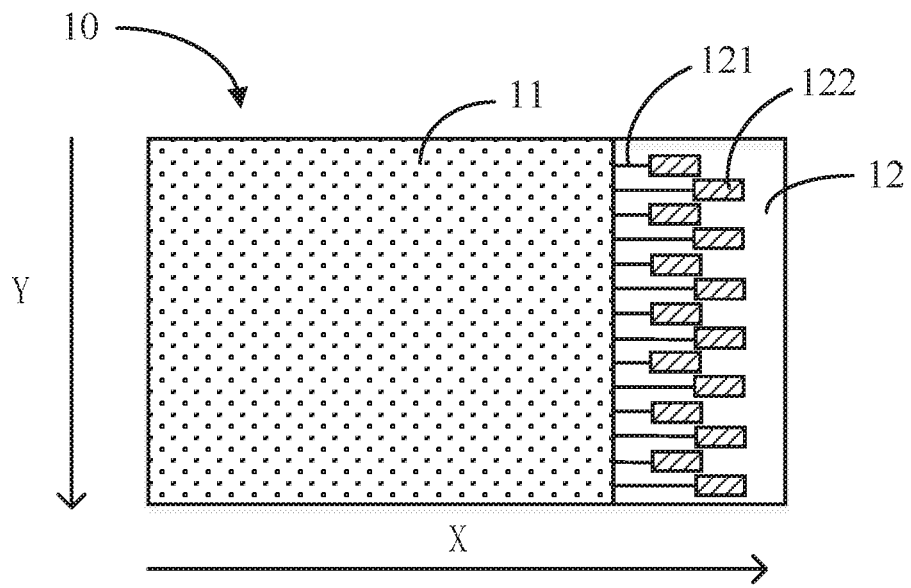
FIG. 3 is a cross-sectional schematic diagram of an array substrate according to still another embodiment of the present disclosure.

A description is provided with reference to FIG. 3. FIG. 3 is a cross-sectional schematic diagram of the array substrate 10 according to still another embodiment of the present disclosure.

Projections of connection terminals 122 in adjacent sub-areas 12a arranged in the first direction X on the reference plane in the second direction Y are connected.

When the area of connection terminals 122 comprises two sub-areas 12a, the projections of the connection terminals 122 in the adjacent sub-areas 12a on the reference plane in the second direction Y partially overlap or connect to each other. When the area of connection terminals 122 comprises more than two sub-areas 12a, projections of at least connection terminals 122 existing in the adjacent sub-areas 12a on the reference plane in the second direction Y partially overlap or just connect to one point.

Projections of connection terminals 122 in all adjacent sub-areas 12a arranged in the first direction X on the reference plane in the second direction Y connect to one another.

That is, no matter the area of connection terminals 122 comprises the two sub-areas 12a or the more than two sub-areas 12a, the projections of the connection terminals 122 in all the adjacent sub-areas 12a on the reference plane in the second direction Y partially overlap or connect to one another.

Figure 4:
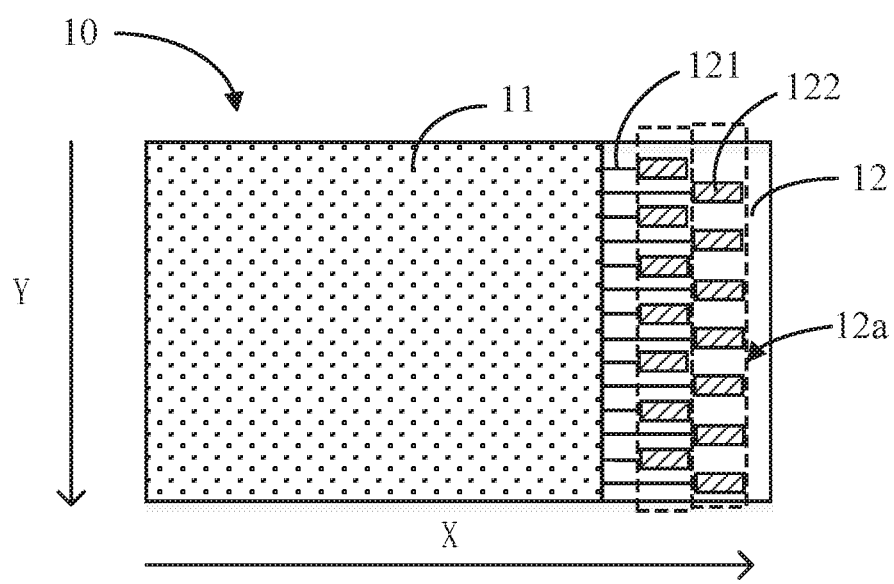
FIG. 4 is a cross-sectional schematic diagram of an array substrate according to yet another embodiment of the present disclosure.

FIG. 4 is a cross-sectional schematic diagram of the array substrate 10 according to yet another embodiment of the present disclosure.

In order to further increase the fault tolerance when the connection terminals 122 are bonded to the IC terminals, the present disclosure disposes the connection terminals in the adjacent sub-areas 12a arranged in the first direction X in such a manner that a spacing exists between their projections on the reference plane in the second direction Y.

When the area of connection terminals 122 comprises the two sub-areas 12a, the spacing exists between the projections of the connection terminals 122 in the adjacent sub-areas 12a on the reference plane in the second direction Y. When the area of connection terminals 122 comprises the more than two sub-areas 12a, the spacing exists between the projections of at least the connection terminals 122 in the adjacent sub-areas 12a on the reference plane in the second direction Y. In other words, there may also be a partial overlap or a connection of the projections of the connection terminals 122 in the adjacent sub-areas 12a on the reference plane in the second direction Y. In greater detail, the arrangement may be determined depending on practical needs.

Spacings exist between the projections of the connection terminals 122 in all the adjacent sub-areas 12a arranged in the first direction X on the reference plane in the second direction Y.

That is, no matter the area of connection terminals 122 comprises the two sub-areas 12a or the more than two sub-areas 12a, the spacings exist between the projections of the connection terminals 122 in all the adjacent sub-areas 12a on the reference plane in the second direction Y.

In one embodiment, the spacings existing between the projections of the connection terminals 122 in all the adjacent sub-areas 12a arranged in the first direction X on the reference plane in the second direction Y are the same.

In one embodiment, spacings between the connection terminals 122 in all the adjacent sub-areas 12a in the second direction Y are the same. That is, the connection terminals 122 in the adjacent sub-areas 12a are equidistantly disposed.

In one embodiment, the array substrate 10 further comprises an insulating layer. The insulating layer covers the signal conversion lines 121. The insulating layer insulates and protects the signal conversion lines 121 to prevent the signal conversion lines 121 from contacting with other metals to cause a short circuit.

The embodiment of the present disclosure provides a display panel, such as a liquid crystal panel. The display panel comprises the array substrate. The array substrate comprises a display area and a bonding area. The bonding area is disposed at one end of the display area, and comprises a signal conversion area and an area of connection terminals. The signal conversion area is disposed with signal conversion lines. The area of connection terminals is disposed with the connection terminals. The signal conversion lines are connected to the connection terminals correspondingly.

Each of the signal conversion lines extends in a first direction, and connects two connection terminals adjacent to the each of signal conversion lines. Projections of the connection terminals on a reference plane in a second direction do not overlap. The reference plane is parallel to the first direction and perpendicular to disposition planes of the connection terminals. The second direction is perpendicular to the reference plane.

According to one embodiment of the present disclosure, the area of connection terminals comprises at least two sub-areas, projections of connection terminals in the sub-areas on the reference plane in the second direction overlap.

According to one embodiment of the present disclosure, the connection terminals in the sub-area have a same size.

According to one embodiment of the present disclosure, the connection terminals in the sub-area are formed in a same process.

According to one embodiment of the present disclosure, projections of connection terminals in adjacent sub-areas arranged in the first direction on the reference plane in the second direction are connected.

According to one embodiment of the present disclosure, projections of connection terminals in all adjacent sub-areas arranged in the first direction on the reference plane in the second direction connect to one another.

According to one embodiment of the present disclosure, a spacing exists between projections of connection terminals in adjacent sub-areas arranged in the first direction on the reference plane in the second direction.

According to one embodiment of the present disclosure, spacings exist between projections of connection terminals in all adjacent sub-areas arranged in the first direction on the reference plane in the second direction.

According to one embodiment of the present disclosure, the spacings existing between the projections of the connection terminals in all the adjacent sub-areas arranged in the first direction on the reference plane in the second direction are the same.

According to one embodiment of the present disclosure, spacings between connection terminals in all adjacent sub-areas in the second direction are the same.

The present disclosure provides a new array substrate and a new display panel. The array substrate comprises the display area and the bonding area located at one end of the display area. The bonding area comprises the signal conversion lines and the connection terminals correspondingly connected to each other. Each of the signal conversion lines extends in the first direction, and connects two connection terminals adjacent to the each of signal conversion lines. Projections of the connection terminals on the reference plane in the second direction do not overlap. In this manner, the design that the adjacent connection terminals are interlaced can increase the spacing between the adjacent connection terminals, thus resolving the problem that the spacing between connection terminals on the array substrate is excessively small and short circuiting tends to happen when bonding to cause poor bonding in the related art.

The present disclosure is described in detail in accordance with the above contents with the specific preferred examples. However, this present disclosure is not limited to the specific examples. For the ordinary technical personnel of the technical field of the present disclosure, on the premise of keeping the conception of the present disclosure, the technical personnel can also make simple deductions or replacements, and all of which should be considered to belong to the protection scope of the present disclosure.

What is claimed is:

1. An array substrate comprising:
   a display area; and
   a bonding area disposed at one end of the display area, and comprising a signal conversion area and an area of connection terminals, the signal conversion area being disposed with signal conversion lines, the area of connection terminals being disposed with the connection terminals, the signal conversion lines being connected to the connection terminals correspondingly;
   wherein each of the signal conversion lines extends in a first direction, and connects two connection terminals adjacent to the each of signal conversion lines, projections of the connection terminals on a reference plane in a second direction do not overlap, the reference plane is parallel to the first direction and perpendicular to disposition planes of the connection terminals, the second direction is perpendicular to the reference plane; and
   wherein projections of connection terminals in adjacent sub-areas arranged in the first direction on the reference plane in the second direction connect to one another.

2. The array substrate as claimed in claim 1, wherein the area of connection terminals comprises at least two sub-areas, projections of connection terminals in the sub-areas on the reference plane in the second direction overlap.

3. The array substrate as claimed in claim 2, wherein the connection terminals in the sub-area have a same size.

4. The array substrate as claimed in claim 2, wherein the connection terminals in the sub-area are formed in a same process.

5. The array substrate as claimed in claim 2, wherein projections of connection terminals in all adjacent sub-areas arranged in the first direction on the reference plane in the second direction connect to one another.

6. A display panel comprising an array substrate, the array substrate comprising:
   a display area; and
   a bonding area disposed at one end of the display area, and comprising a signal conversion area and an area of connection terminals, the signal conversion area being disposed with signal conversion lines, the area of connection terminals being disposed with the connection terminals, the signal conversion lines being connected to the connection terminals correspondingly;
   wherein each of the signal conversion lines extends in a first direction, and connects two connection terminals adjacent to the each of signal conversion lines, projections of the connection terminals on a reference plane in a second direction do not overlap, the reference plane is parallel to the first direction and perpendicular to disposition planes of the connection terminals, the second direction is perpendicular to the reference plane; and
   wherein projections of connection terminals in adjacent sub-areas arranged in the first direction on the reference plane in the second direction are connected.

7. The display panel as claimed in claim 6, wherein the area of connection terminals comprises at least two sub-areas, projections of connection terminals in the sub-areas on the reference plane in the second direction overlap.

8. The display panel as claimed in claim 7, wherein the connection terminals in the sub-area have a same size.

9. The display panel as claimed in claim 7, wherein the connection terminals in the sub-area are formed in a same process.

10. The display panel as claimed in claim 7, wherein projections of connection terminals in all adjacent sub-areas arranged in the first direction on the reference plane in the second direction connect to one another.

* * * * *